United States Patent [19]

Burwen

[11] 3,753,159

[45] Aug. 14, 1973

[54] VARIABLE BANDPASS DYNAMIC NOISE FILTER

[76] Inventor: Richard S. Burwen, 12 Holmes Rd., Lexington, Mass. 02108

[22] Filed: July 26, 1971

[21] Appl. No.: 166,197

Related U.S. Application Data

[63] Continuation-in-part of Ser. No. 86,398, Nov. 3, 1970, Pat. No. 3,678,416.

[52] U.S. Cl. .................... 333/17, 179/1 P, 307/233, 328/167, 330/107, 330/109

[51] Int. Cl. .............................................. H03h 7/12

[58] Field of Search .................. 333/17, 28 T, 70 R; 325/477; 179/1 D, 1 P, 1 VC; 330/107, 109; 328/167

[56] References Cited

UNITED STATES PATENTS

| | | | |
|---|---|---|---|
| 3,644,847 | 2/1972 | Neuman | 333/17 |
| 2,413,263 | 12/1946 | Suter | 333/17 |
| 2,606,971 | 8/1952 | Scott | 333/70 R X |
| 3,543,191 | 11/1970 | Plunkett | 333/17 |

*Primary Examiner*—Paul L. Gensler
*Attorney*—Joseph Weingarten, Lawrence A. Maxham et al.

[57] ABSTRACT

A variable bandpass filter for a dynamic noise filtering effect that reduces the perceptible noise in an audio reproduction system. The variable bandpass filter responds to peak signal levels in relatively high and relatively low frequency portions of the audio spectrum to automatically and independently vary high and low frequency cutoff points for the filter in correspondence with the level of signals at those frequencies. Low distortion and wide dynamic range is achieved in a filter configuration which comprises a forward signal path and a reverse signal path, each having a variable integration response provided by temperature compensated and linearized field-effect transistor circuits. The integration response of the two paths imparts a high and low frequency filtering effect. A further constant gain feedback path establishes a uniform middle frequency amplification for the variable bandpass filter.

17 Claims, 4 Drawing Figures

INVENTOR
RICHARD S. BURWEN
BY
Weingarten, Maxham & Schurgin
ATTORNEYS

INVENTOR
RICHARD S. BURWEN

BY
Weingarten, Maxham & Schurgin
ATTORNEYS

VARIABLE BANDPASS DYNAMIC NOISE FILTER

CROSS-REFERENCE TO RELATED APPLICATION

This application is a continuation-in-part of copending United States patent application Ser. No. 86,398, now U.S. Pat. No. 3,678,416 filed Nov. 3, 1970 by Richard S. Burwen for DYNAMIC NOISE FILTER.

FIELD OF THE INVENTION

This invention relates to audio noise reducing systems and in particular to automatically variable bandpass systems for minimizing audio noise awareness.

BACKGROUND OF THE INVENTION

In my above-referenced copending United States patent application there is an explanation of how a listener's awareness of audio noise is greatly reduced by the presence of a "masking" audio signal in the same frequency range as the noise. It was noted there that although prior attempts had been made to reduce the awareness of noise by filtering out those portions of the audio spectrum which contained no noise masking signal, the prior systems were unsuccessful in providing a noise reduction benefit compatible with modern audio systems having low distortion and wide frequency response demands.

In the above-referenced United States patent application a system is disclosed for providing improved variable bandpass filtering which is compatible with the other demands of modern audio systems.

BRIEF SUMMARY OF THE INVENTION

In the present invention an improvement is indicated for the implementation of a dynamic noise filter of the type indicated in the above-referenced copending application.

In a preferred embodiment illustrative of the improvement a variable bandpass filter according to the invention provides wide dynamic range and low distortion filtering of the high and low frequency portions of the full audio spectrum to a degree varying inversely with high and low frequency signal content. From providing a narrow pass band within the audio range when no signal is present, the filter increases and decreases the high and low frequency cutoff points respectively as the signal content in the high and low frequency portions increase.

The variable bandpass filter consists of an integrating forward signal path and an integrating feedback signal path connected in a closed loop. An additional resistive feedback path is provided to produce a mid-frequency amplification reference. Field-effect transistor biasing circuits control the rates of integration of each path and reduce unwanted variations in the rates of integration. FET biasing circuits respond to respective control signals which are developed with a fast attack and slow decay characteristic in response to signal content in the upper and lower frequency portions of the audio range.

The field-effect transistor biasing circuits which control the cutoff points further provide temperature compensation, linearization of variation in integration rate, and a reduction in second harmonic distortion in the signal path. The signal loop also includes means for attaining very flat response within the audible range when the response of the filter is extended to its extreme high and low frequency cutoff points, and the circuit configuration maintains the gain of the center frequency of the variable bandpass filter substantially constant throughout the range of variation in its cutoff points.

DESCRIPTION OF THE DRAWINGS

These and other features of the invention will be more clearly perceived by reference to the below detailed description of a preferred embodiment presented for purposes of illustration, and not by way of limitation, and to the accompanying drawings of which.

DETAILED DESCRIPTION OF THE PREFERRED EMBODIMENT

Figure 1:
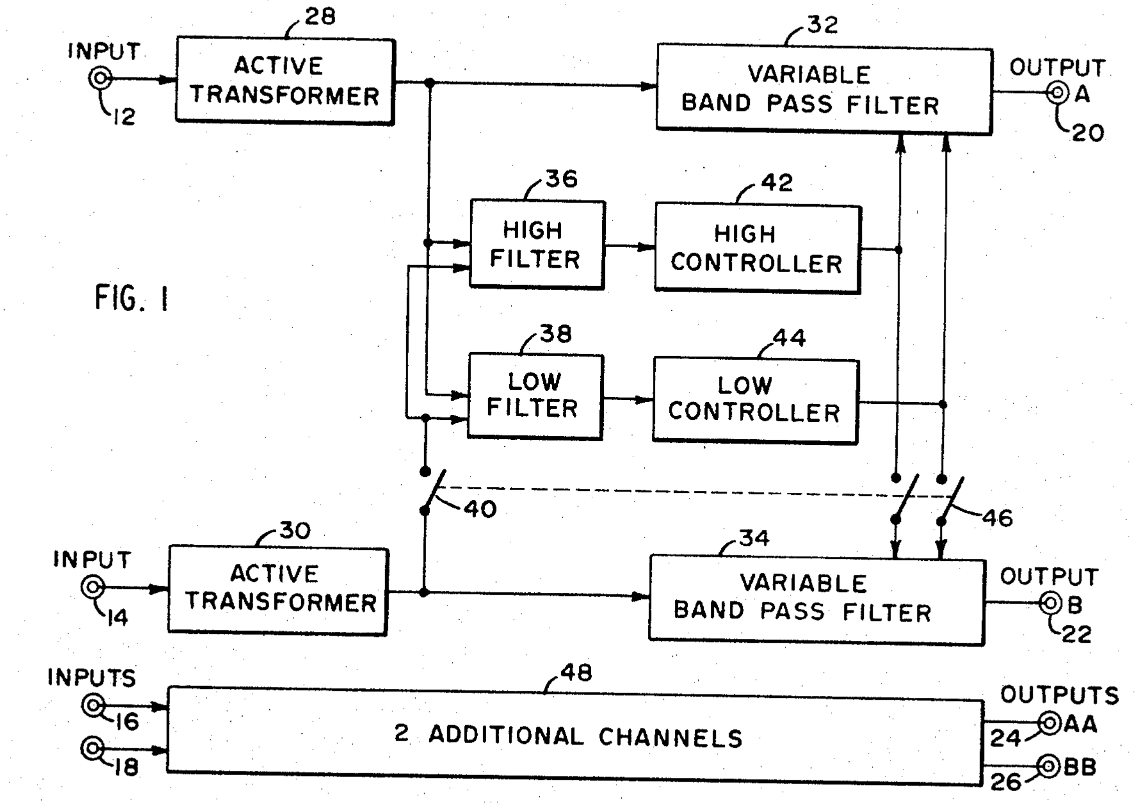
FIG. 1 is a system block diagram of a multichannel dynamic noise filter embodying a novel variable bandpass filter.

In the conventional audio reproduction system it is usual to have two or more separate audio channels to produce the well known stereo effect of spaciousness. A multichannel system operative in accordance with the invention is displayed in FIG. 1. A four channel dynamic noise filter is shown having inputs 12–18 and outputs 20–26. The inputs 12 and 14 receive an audio signal for noise reduction and apply respective signals to active transformers 28 and 30 which are typically differential amplifiers with high common mode rejection. The respective outputs of active transformers 28 and 30 are applied to variable bandpass filters 32 and 34, and the output of the active transformer 28 is also applied to both a high-pass filter 36 and low-pass filter 38. The output of active transformer 30 leads through a switch 40 for selective application to the filters 36 and 38. Normally, the filters 36 and 38 sum the signals from transformers 28 and 30. Alternatively filters 36 and 38 are made responsive to the highest of the signals from the transformers.

The filters 36 and 38 provide respective outputs to high and low frequency controllers 42 and 44 respectively. The outputs of the controllers 42 and 44 are in turn applied as control inputs to the variable bandpass filter 32. A double pole switch 46, ganged with switch 40, selectively passes the output of the controllers 42 and 44 to control inputs of the variable bandpass filter 34. The outputs of the variable bandpass filters 32 and 34 provide the outputs 20 and 22 respectively.

From the inputs 16 and 18 an identical system 48 of two additional channels receive these inputs for variable bandpass filtering and provides respectively filtered signals to outputs 24 and 26.

In operation, the variable bandpass filters 32 and 34 are caused to vary their audio cutoff points over a thirty to one frequency ratio encompassing the entire audio range. A minimum bandpass filter passes a narrow portion of the audio range centered about 700 Hz. Pass band variation is accomplished by adjusting high and low frequency filter cutoff points in response to the output of the high and low frequency controllers 42 and 44. The high-pass filter 36 selects and passes predominantly signals in the range of variation of the high frequency cutoff point. The controllers 42 and 44 produce a fast attack, slow decay signal representative of the signal content in the respective high and low frequency portions of the audio range. Their respective signals operate within the bandpass filters 32 and 34 to lower the low frequency cutoff point and raise the high frequency cutoff point in response to high and low frequency signal content.

Normally the filter bandwidth begins to increase with the high and low frequency signal levels at the noise level of the input signal, and the bandwidth achieves maximum response for medium level input signals.

For use as a stereo system in which the outputs 20 and 22 represent audio signals separated by a distance a saving in components is possible from the use of a single control system as indicated in FIG. 1. Moreover by using a single high and low frequency control system for both bandpass filters 32 and 34 the gain and phase of each channel is maintained identical.

Additional channels 48 may be added duplicating the electronics for the above described channels to provide a further enhancement of the spacious quality of the reproduced audio. The additional channels 48 may have their own high and low frequency controller system operating as indicated above for the first two channels, or may be adapted to operate from the same control signals as used for the variable bandpass filters 32 and 34.

In order to provide the variable bandpass filtering and achieve a dynamic range of approximately 30 to 1 in the variation of the cutoff points a substantial degree of signal alteration is required. Circuits accomplishing these functions and providing low distortion and low noise are difficult to realize, due in part to the necessity of many signal path components. In the variable bandpass filter of FIG. 2, a new preferred filter design is indicated for providing a low distortion, wide range variable high and low frequency cutoff function in the audio range. The filter employs a variable filtering technique based on variations in integration rates as presented in the above-referenced patent application but employs novel configuration and control circuitry. Within the variable bandpass filter a high frequency preemphasis circuit 52 receives the output of an active transformer and provides high frequency emphasis thereto. The signal at its output is passed through a resistor 54 to a forward signal path 56 composed of a filter 58, for sharpening the filter corner shape 63 of FIG. 2A at the higher extremes of the high frequency cutoff point and a high frequency variable rate integrator 60. A negative feedback signal path is provided through a resistor 61 from the output of the integrator 60 to its input. Another negative feedback signal path 62 leads from the output of the variable rate integrator 60 to the junction between the resistor 54 and filter 58 through a low frequency variable rate integrator 64 and a filter 66 that sharpens the filter corner shape 65 at the lower extremes of the low frequency cutoff points in FIG. 2A.

Proceeding to a more detailed description, within the filter 58, a parallel shunt combination of a resistor 68 and capacitor 70 operate to provide a phase shift characteristic that sharpens the corner shape at high frequencies to prevent rounding and signal distortion that otherwise might occur.

The signal from the filter 58 is applied within the variable rate integrator 60 through a DC blocking capacitor 72 to one controlled terminal of a field-effect transistor (FET) 74. The other controlled terminal of FET 74 is conducted to the input of an integrating amplifier 76 having a negative feedback capacitor 78 therearound. A DC bypass resistor 80 is connected between the input of amplifier 76 and the input to the variable rate integrator 60.

Also connected at the input to the integrator 60 is a unity gain amplifier 82 which provides an output through a resistor 84 to the gate terminal of the FET 74. A further resistor 86, of value equal to that of resistor 84, is connected between the gate terminal and the output of a differencing amplifier 88. An inverting input of the amplifier 88 is grounded and a noninverting input receives through a resistor 90 a high frequency DC control signal on a line 92. A controlled terminal of a second FET 94 is also connected to the noninverting input of amplifier 88. A first reference signal 96 supplies current through a resistor 98 to the other controlled terminal of FET 94 and through a resistor 100 to ground. A resistor 102 is connected across the controlled terminals of FET 94. The output of amplifier 88 is applied through a resistor 104 to the gate terminal of FET 94, and a resistor 106 is connected between the gate and the junction between resistors 98 and 100.

In operation, the integrating amplifier 76 provides a gain which decreases with frequency, the level of the gain at any given frequency being dependent upon the resistance between the controlled terminals of the FET 74. That resistance is determined by the bias signal applied to the gate terminal from the output of the amplifier 88. Amplifier 88 is adjusted to have sufficient gain so that it operates similar to an operational amplifier by providing feedback to control the resistance of the FET 94 and further maintain the level of the noninverting input to the amplifier 88 at substantially the same voltage, usually ground. In this manner, as the high frequency control signal on line 92 increases, the resistance between the controlled terminals of FET 94 is caused to decrease so as to create a balancing increase in current through the FET 94 that counteracts the increase in current through the resistor 90 from the high frequency control signal.

The combination of the unity gain amplifier 82 and the equal resistances 84 and 86 helps to maintain the potential at the gate input of the FET 74 approximately midway between the potentials at its controlled terminals. The capacitor 72 eliminates net DC current flow through the controlled terminals of the FET 74 to minimize DC transients at the output of integrator 60. The amplifier 82 and resistances 84 and 86 help to linearize the response of the FET 74 and reduce or eliminate second harmonic distortion by maintaining its gate AC signal level intermediated the level of its controlled terminals.

The interconnection of the FET 94 with the amplifier 88 to provide a bias signal for the gate of the FET 74 produces a temperature compensating effect and linearizes the variation of the high frequency cutoff point with the level of the high frequency control signal on line 92. By forming the FETs 74 and 94 out of the same or similar semiconductor material and placing them in thermal contact, the temperature effects on both FETs are kept the same. Thus, when the resistance of FET 94 is lowered in response to a thermal change, the output of the amplifier 88 is correspondingly altered so as to restore the original resistance in FET 94 and, at the same time, also the resistance in FET 74. Moreover, because of the feedback relationship of the FET 94 and amplifier 88 a more accurate inverse variation in the resistance of the FET 74 with the level of the high frequency control signal on line 92 is obtained.

In overall operation, as the high frequency control signal increases, indicating more high frequency signal content, the value of both FETs 94 and 74 is caused to decrease in resistance. This causes the integration rate of the amplifier 76 to increase, to augment its high frequency response and to shift the high frequency cutoff point in FIG. 2A to a higher frequency.

Figures 2, 2A:
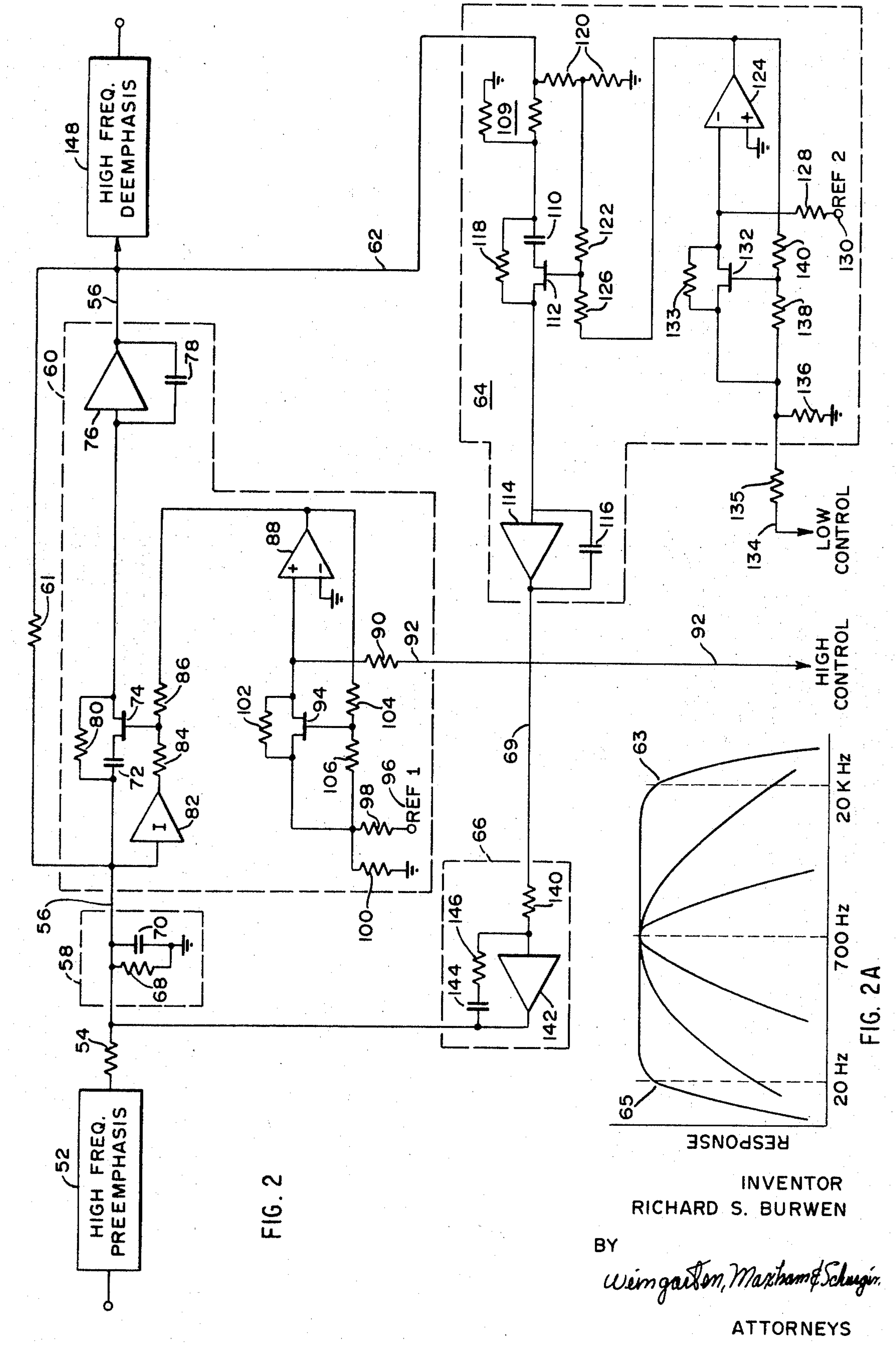
FIG. 2 is a partial block and partial schematic diagram of a preferred variable bandpass filter.
FIG. 2A is a response versus frequency curve helpful in understanding the operation of the circuitry of FIG. 2.

At middle frequencies where the feedback of amplifier 76 through path 62 is low and its gain correspondingly high, feedback through the resistor 61 provides a gain limit for the integrator 60 as indicated at 700 Hz in FIG. 2A.

In the integrator 64, the output from the integrating amplifier 76 is applied through an attenuating voltage divider 109 and a DC blocking capacitor 110 to one controlled terminal of an FET 112. This signal from the other controlled terminal of the FET 112 is applied to an integrating amplifier 114 having an integrating, negative feedback capacitor 116 connected therearound. A DC bypass resistor 118 is connected between the input to the integrating amplifier 114 and the input from the voltage divider pair 109. The input of the integrator 64 is also applied through an attenuator 120 which in turn provides an output signal through a resistor 122 to the gate terminal of the FET 112. In the usual case where the output impedance of amplifier 76 is low, the unity gain amplifier may be deleted since its buffering effect is not needed, and it is here replaced with attenuator 120. A differencing amplifier 124 provides an output signal through a resistor 126, equal in value to resistor 122, also to the gate terminal of FET 112. A noninverting input of the amplifier 124 is grounded while an inverting input is supplied with the current difference of two paths, one through a resistor 128 from a second reference potential 130. The second path is through controlled conduction terminals of an FET 132, with a parallel resistor 133 connected thereacross, from the low frequency control signal on a line 134. The control signal on line 134 is voltage divided through resistors 135 and 136 and applied to the gate terminal of the FET 132 through a resistor 138. A resistor 140 is connected between the gate terminal of FET 132 and the output of the amplifier 124.

In operation, the variable rate integrator 64 functions similarly to the variable rate integrator 60 except that the control signal and reference signal are applied at opposite points in integrator 64 compared to integrator 60. Thus, an increase in the flow frequency control signal, indicative of greater low frequency signal content, increases the values of the resistance of the FETs 112 and 132. The increase in resistance in the FET 112 causes the gain versus frequency curve of the integrating amplifier 114 to shift and to reduce the low frequency feedback around integrator 60. The further result is that the low frequency response of the variable bandpass filter is extended by lowering the low frequency cutoff point. Resistors 122 and 126 operate as indicated above to maintain the gate AC signal level intermeidate the AC signal levels of the controlled terminals for FET 112. FETs 112 and 132 together on the same thermal environment provide temperature compensation, and linearize the change in resistance versus low frequency control signal so that the low frequency cutoff point accurately varies inversely with that control signal. The circuit, in overall operation, performs the function of a signal divider as indicated in the above-reference copending United States patent application.

The output of the variable rate itegrator 64 is applied to the low frequency corner shaping circuit 66, and is received through a resistor 140 at the input of an amplifier 142. The amplifier 142 has a feedback path therearound composed of a capacitor 144 and resistor 146. The components are adjusted to provide additional low frequency gain in the feedback path that sharpens the low frequency cutoff corner at the low frequency extremes.

The combined effect of the components in the signal loop is to cause the bandpass filter to have a substantially narrow bandwidth centered about 700 Hz in the absence of any control signal in either the high or low frequency portions and to move its high and low frequency cutoff points higher and lower respectively in response to increasing high and low frequency control signals. As the high and low frequency cutoff points are moved away from the center frequency the gain of the center frequency is maintained constant as indicated in FIG. 2A.

As can be seen in FIG. 2A the shapes of the high and low frequency cutoffs are the same as would be produced by single stage R-C low-pass and high-pass filters. At minimum bandwidth, however, where the high and low frequency cutoffs merge, the maximum or center frequency gain is held constant by feedback through resistor 61. This is an advantage over cascaded variable low-pass and high-pass filters.

At maximum high frequency bandwidth the high frequency corner is sharpened by filter 58 to provide an essentially flat response from the 700 Hz center frequency up to approximately 20 kHz at the high frequency extreme. A similar effect is produced by filter 66 for the low frequency extreme, sharpening the corner and flattening the response from 700 Hz to below 20Hz.

From the output of the variable rate integrator 60 a high frequency deemphasis circuit 148 provides deemphasis complementary to the high frequency preemphasis of circuit 52. The output of the variable bandpass filter is taken from the output of the high frequency deemphasis.

Figure 3:
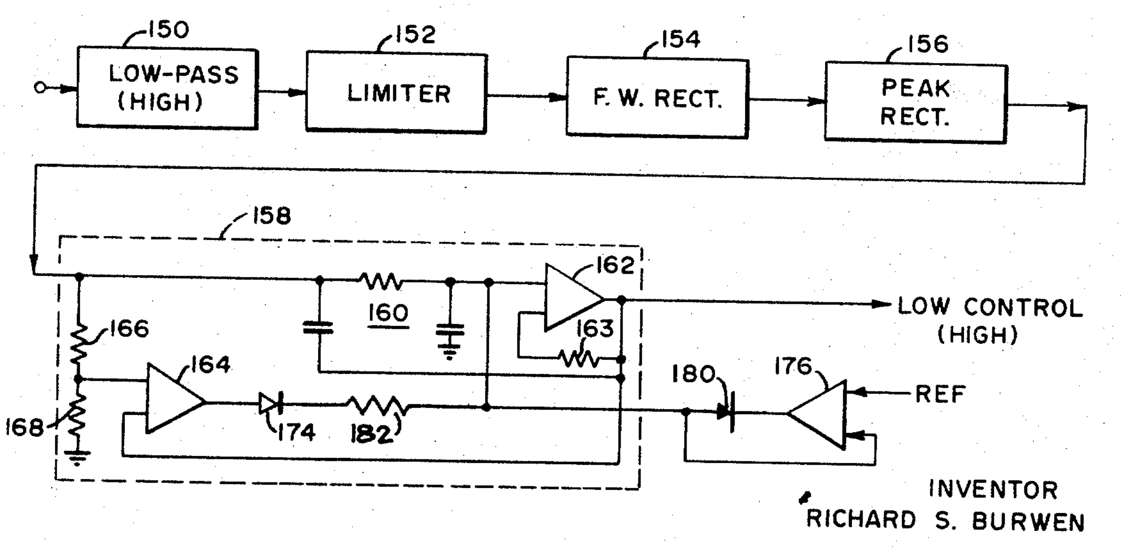
FIG. 3 is a partial block and partial schematic diagram of means for developing a high or low frequency control signal for varying the cutoff point of the variable bandpass filter in FIG. 2.

The high and low frequency control signals are produced from circuitry indicated in FIG. 3. For developing a low frequency control signal the same signal which is applied to the input of the variable bandpass filter is fed to a low-pass filter 150 to select and pass predominantly low frequency signal components, those which lie in the range of variation of the low frequency cutoff point. The filter 150 provides a function similar to filters 36 and 38 in FIG. 1. The output of low-pass filter 150 is applied to a signal amplitude limiter 152 to prevent excessively high signal levels from effecting subsequent circuitry. The output of the limiter 152 is applied to a full-wave rectifier 154 and peak rectifier 156. These may be of the type indicated in the above-reference copending United States patent application to provide a fast attack, slow decay characteristic in responding to the output of the limiter 152. The output of the peak rectifier of 156 is applied to a nonlinear filter 158 which is preferably as indicated in FIG. 3, comprising an RC $\pi$ filter 160 receiving the output of the rectifier 156 and applying it to a differential amplifier 162. The output of the differential amplifier 162 is fed back to itself through a resistor 163, to the low side of the first capacitor in the RC $\pi$ filter 160 and to a differential input of a further amplifier 164. A second input of the amplifier 164 is supplied with the input to the nonlinear filter 158 as attenuated by voltage divider resistances 166 and 168. The output of the amplifier 164 is conducted through a diode 174 to the same input of the amplifier 162 at which the filter 160 is connected. This same input is also supplied a signal from the output of an amplifier 176 through a diode 180. Amplifier 176 receives differentially a reference input and the signal from diode 180.

The operation of the nonlinear filter 158 is such as to cause signal filtering and smoothing by the RC $\pi$ filter 160 with augmented response produced by the feedback from the amplifier 162. Whenever the input to the nonlinear filter 158, however, exceeds the smoothed and filtered output of the amplifier 162 by a predetermined percentage, determined by the voltage divider resistors 166 and 168, the output of amplifier 164 rapidly increases, overcomes the turn-on potential of the diode 174, and causes the amplifier 162 to respond more rapidly to the signal input to the nonlinear filter. A range limiting function is provided by amplifier 176 and diode 180 to establish a maximum signal level for the low frequency control signal which is taken from its output. A further resistor 182, connected between the diode 174 and amplifier 162 gives precedence to the limiting function.

In order to produce the high frequency control signal, a high-pass filter is substituted for the low-pass filter 150 FIG. 3, while in other respects the circuitry operates in substantially the same manner in producing the high frequency control signal.

Having above described a preferred embodiment according to the invention it will occur to those skilled in the art that modifications and alterations can be made to the specific circuitry without departing from the spirit of the invention. Accordingly, it is intended to limit the scope of the invention only as indicated in the following claims.

What is claimed is:

1. A low distortion, variable frequency response filter operative to vary a cutoff frequency over a wide dynamic range in response to a control signal including:

filter means having a gain characteristic varying unidirectionally with frequency;

means for reducing the gain variation of said filter means to provide an upper limit to the gain of said filter means whereby said filter means has a frequency response curve substantially flat over a portion and varying unidirectionally with frequency over a further portion, said cutoff frequency being between said portions;

variable impedance means for determining the gain of said filter means as a function of its impedance with said cutoff point being correspondingly determined by the impedance of said variable impedance means;

means for causing the impedance of said variable impedance means to vary in response to said control signal; and said reducing means including feedback means for controlling said upper gain limit of said filter means during variation in said cutoff point.

2. The variable frequency response filter of claim 1 further including in said means for causing said impedance variation in response to said control signal:

means for filtering the signal applied to said variable frequency response filter and responsive primarily to the range of frequencies over which said cutoff point varies;

means for peak rectifying the filtered signal; and means for nonlinearly filtering the peaked rectified signal to provide, in association with said peak rectifying means, said control signal with a smoothed, fast attack and slow decay characteristic in response to signal levels predominantly in the corresponding range of frequencies.

3. The variable frequency response filter of claim 1 further including means for reducing DC transients from said filter means in response to variations in said variable impedance means from said control signal.

4. The low distortion, variable frequency response filter of claim 1 wherein said means for controlling said upper gain limit includes means for reducing the variation therein during variation in said cutoff point.

5. A low distortion, variable frequency response filter operative to vary a cutoff frequency over a wide dynamic range in response to a control signal, said filter including:

filter means having a gain characteristic varying unidirectionally with frequency and including:

an integrator providing said variable gain characteristic and having a first variable impedance in an input thereto;

a second variable impedance;

a feedback control circuit operative to provide a bias signal which varies the impedance of said first and second variable impedances in response to said control signal;

means for associating said second variable impedance with said control circuit to cause a variation in said bias signal in response to a variation in the impedance of said second variable impedance and to cause compensation in the variation of said first variable impedance induced by changes in operating conditions of said first and second variable impedances;

means for reducing the gain variation of said filter means to provide an upper limit to the gain of said filter means whereby said filter means has a frequency response curve substantially flat over a portion and varying unidirectionally with frequency over a further portion, said cutoff frequency being between said portions;

means for associating said first variable impedance with said filter means for determining the gain of said filter means according to its impedance, said cutoff point being correspondingly determined by the impedance of said first variable impedance.

6. The variable frequency response filter of claim 5 wherein:

said first and second variable impedance means are field-effect transistors; and means are provided to cause the signal level of the gate of said first variable impedance means to be substantially midway between the signal levels of the controlled terminals thereof to reduce distortion.

7. A variable bandpass audio frequency filter comprising:

a forward signal path having a gain characteristic varying unidirectionally with frequency;

a reverse signal path having a similar gain characteristic varying unidirectionally with frequency and providing signal feedback around said forward signal path;

first means for providing wide range adjustment in the position of the gain characteristic of said forward signal path in response to signal content in a first portion of the audio frequency range;

second means for providing wide range adjustment in the position of the gain characteristic of said reverse signal path in response to signal content in a second portion of the audio frequency range;

said second adjustment providing means including means for adjusting the gain characteristic oppositely to said first adjustment providing means in response to signal content; and means for limiting the gain of said forward signal path to provide a substantially constant center frequency gain to said variable bandpass filter.

8. The variable bandpass filter of claim 7 wherein:

said forward and reverse signal paths comprise variable rate integration circuits; and said first and second adjustment providing means include field-effect transistor inputs to said integration circuits and means for controlling the resistance of said field-effect transistors in response to the respective signal contents thereby to control the rate of integration and signal filtering characteristics of said forward and reverse signal paths.

9. A variable bandpass filter having an input terminal and an output terminal, said filter comprising:

a forward signal path for conduction between said input and output terminals;

a parallel reverse signal path for conduction between said input and output terminals;

a feedback circuit operative to limit the gain of said forward path;

said forward signal path including:

first means having a gain characteristic varying with frequency;

first variable resistance means operative to determine the position of the gain characteristic of said first variable gain means and operative to vary its resistance in response to a first bias signal applied to a control input thereof;

first means for developing said first bias signal to represent the difference in signal level between a first reference and a first control signal;

second variable resistance means operative to vary the resistance between said first developing means and one of said first reference and first control signals;

feedback means associated with said first developing means for causing the resistance of said second variable resistance means to vary in response to said first bias signal;

said reverse signal path including:

second means having a gain characteristic varying unidirectionally with frequency;

third variable resistance means operative to determine the position of the gain characteristic of said second variable gain means and operative to vary its resistance in response to a second bias signal applied to a control input thereof;

second means for developing said second bias signal representative of the difference in signal level between a second reference and a second control signal;

fourth variable resistance means connected to vary the resistance between said second developing means and one of said second reference and second control signals; and feedback means associated with said second developing means for causing the resistance of said fourth variable resistance means to vary in response to variation in said second bias signal.

10. The variable bandpass filter of claim 9 wherein said first and second variable resistance means are maintained in substantially the same temperature environment and said third and fourth variable resistance means are maintained in substantially the same temperature environment whereby temperature changes effecting said first and third variable resistance means are compensated by changes in said first and second bias signals induced by corresponding changes in said second and fourth variable resistance means.

11. The variable bandpass filter of claim 9 wherein:

means are provided for maintaining the AC signal levels on the control inputs of said first and third variable resistance means approximately midway between the AC signal levels of controlled terminals thereof; and said variable resistance means are field-effect transistors.

12. The variable bandpass filter of claim 9 wherein:

said forward and feedback signal paths are connected in a closed loop; and said closed loop includes means for providing a substantially flat gain characteristic in the response of said variable bandpass filter at maximum pass band widths.

13. The variable bandpass filter of claim 9 further including:

means for preemphasizing high frequencies applied to said variable bandpass filter; and means for deemphasizing high frequencies in the signal at the output of said variable bandpass filter.

14. The variable bandpass filter of claim 9 further including as means for developing said first and second control signals:

means for filtering the signal applied to said variable bandpass filter and responsive primarily to the range of frequencies over which a cutoff point of said variable bandpass filter varies in response to one of said first and second control signals;

means for peak rectifying the filtered signal; and means for nonlinearly filtering the peaked rectified signal to provide, in association with said peak rectifying means, said one of said first and second control signals with a smoothed, fast attack and slow decay characteristic in response to signal levels predominantly in the corresponding range of frequencies.

15. The variable bandpass filter of claim 14 further including means for limiting the range of variation in said control signals.

16. The variable bandpass filter of claim 14 wherein said nonlinear filtering means operates to provide smoothing of said peak rectified signal whenever said peak rectified signal is within a predetermined percentage of said nonlinearly filtered signal and to provide fast attack response to said peak rectified signal whenever said peak rectified signal exceeds said predetermined percentage of said nonlinearly filtered signal.

17. The variable bandpass filter of claim 14 operative as a multichannel system wherein:

each channel comprises one of said variable bandpass filters; and one control signal developing means is provided for controlling the bandpass of two or more channels.

* * * * *